:::{.patent-header}
(12) United States Patent  
Gilliland et al.

(10) Patent No.: US 8,186,174 B2  
(45) Date of Patent: May 29, 2012
:::

(54) TEMPERATURE CONTROL SYSTEM FOR AN ELECTRONIC DEVICE CABINET

(75) Inventors: Don A. Gilliland, Rochester, MN (US); Cary M. Huettner, Rochester, MN (US); Max J. C. Koschmeder, Oronoco, MN (US)

(73) Assignee: International Business Machines Corporation, Armonk, NY (US)

( * ) Notice: Subject to any disclaimer, the term of this patent is extended or adjusted under 35 U.S.C. 154(b) by 608 days.

(21) Appl. No.: 12/397,105

(22) Filed: Mar. 3, 2009

(65) Prior Publication Data

US 2010/0226090 A1     Sep. 9, 2010

(51) Int. Cl.
- F25D 23/12    (2006.01)
- F25B 27/00    (2006.01)
- F25B 9/02     (2006.01)
- F28D 15/00    (2006.01)
- H05K 7/20     (2006.01)

(52) U.S. Cl. ........ 62/259.2; 62/238.2; 62/5; 165/104.33; 361/691; 361/688

(58) Field of Classification Search .................. 62/259.2, 62/238.2, 5; 236/49.3; 361/690, 691, 695, 361/688, 724; 165/104.33, 80.3
See application file for complete search history.

(56) References Cited

U.S. PATENT DOCUMENTS

| | | | |
|---|---|---|---|
| 6,990,817 B1 * | 1/2006 | Bhatia | ................................ 62/5 |
| 7,012,807 B2 | 3/2006 | Chu et al. | |
| 7,751,188 B1 * | 7/2010 | French et al. | ................. 361/691 |
| 2004/0099747 A1 * | 5/2004 | Johnson et al. | ............... 236/49.3 |

* cited by examiner

Primary Examiner — Chen Wen Jiang  
(74) Attorney, Agent, or Firm — Cantor Colburn LLP

(57) ABSTRACT

An electronic device cabinet includes a first temperature control system positioned to direct a conditioned airflow into a first electronic device storage zone of the cabinet and a second temperature control system positioned to direct a conditioned airflow into a second electronic device storage zone of the cabinet. The first temperature control system includes a first plurality of vortex tubes having a compressed air inlet and a first cooling air outlet that guides cooling air into the first device storage zone. The second temperature control system includes a second plurality of vortex tubes having a compressed air inlet and a second cooling air outlet that guides cooling air into the second device storage zone. A controller selectively delivers compressed air to respective ones of the first and second temperature control systems upon sensing a demand for cooling in corresponding ones of the first and second electronic device storage zones.

15 Claims, 5 Drawing Sheets

TEMPERATURE CONTROL SYSTEM FOR AN ELECTRONIC DEVICE CABINET

BACKGROUND OF THE INVENTION

1. Field of the Invention

This invention relates to the art of temperature control systems and, more particularly, to a temperature control system for an electronic device cabinet.

2. Description of Background

Computer network systems are growing in use in both large and small companies. Computer networking is used to connect individuals and companies and is an essential tool in modern business practice. Network systems provide internal and external communication, data storage, e-commerce solutions, etc. Most companies now have a dedicated server room or data center that includes multiple cabinets that house servers and other network systems. Each network system generates heat that is emitted into the cabinets. Temperature in the cabinet, as well as in the server room itself, must be regulated in order for the network components to function efficiently. At present, there are a variety of temperature regulation systems in use to regulate cabinet temperatures.

Current temperature control schemes include water cooling systems that pass a flow of cool water through pipes arranged in, or proximate to, the cabinet. Airflow is passed over the pipes and into the cabinet to cool internal components. Water cooling systems represent a significant investment of capital, require a dedicated chilled water source which itself can be cost prohibitive, and/or not available at every location. Other temperature control schemes include the use of fans or vortex cooling tubes. Fans typically do not generate an airflow having sufficient volume to adequately cool most modern electronics. Vortex tubes, while providing sufficient airflow, are presently only configured to direct a single cooling air stream into the cabinet. While the air stream can be directed into multiple portions of a cabinet, not every component has the same cooling requirements. That is, components that are high heat producers, i.e., have a high demand for cooling; receive the same level of cooling as components that produce less heat. Thus, cooling system resources are not put to efficient use. Either the air stream must be set to a high level to satisfy the high heat producing components or at some middle level at which the high heat producing components are not adequately regulated.

SUMMARY OF THE INVENTION

The shortcomings of the prior art are overcome and additional advantages are provided through the provision of an electronic device cabinet constructed in accordance with an exemplary embodiment of the present invention. The electronic device cabinet includes a housing having at least a top wall and first and second opposing sidewalls that collectively define first and second electronic device storage zones. A first temperature control system is positioned to direct a conditioned airflow into the first electronic device storage zone. The first temperature control system includes a first plurality of vortex tubes. Each of the first plurality of vortex tubes includes a compressed air inlet, a cooling air outlet and a heated air outlet. Cooling air is selectively guided from the cooling air outlet of each of the first plurality of vortex tubes into the first electronic device storage zone. A second temperature control system is positioned to direct a conditioned airflow into the second electronic device storage zone. The second temperature control system includes a second plurality of vortex tubes. Each of the second plurality of vortex tubes includes a compressed air inlet, a cooling air outlet and a heated air outlet. Cooling air is selectively guided from the cooling air outlet of each of the second plurality of vortex tubes into the second electronic device storage zone. A controller, operatively connected to each of the first and second temperature control systems, selectively delivers compressed air to the first temperature control system upon sensing a demand for cooling in the first electronic device storage zone, and selectively delivers compressed air to the second temperature control system upon sensing a demand for cooling in the second electronic device storage zone.

In accordance with another exemplary embodiment of the present invention, a method of regulating internal temperatures of an enclosure includes sensing a first temperature in a first electronic device storage zone of the enclosure and comparing the first temperature sensed in the first electronic device storage zone with a first target temperature. The method also includes sensing a second temperature in a second electronic device storage zone of the enclosure and comparing the second temperature sensed in the second electronic device storage zone with a second target temperature. A compressed air stream is selectively introduced to a first plurality of vortex tubes configured to direct a cooling airflow into the first electronic device storage zone when the first temperature is greater than the first target temperature. Similarly, a compressed air stream is selectively introduced to a second plurality of vortex tubes configured to direct a cooling air flow into the second electronic device storage zone when the second temperature is greater than the second target temperature.

Additional features and advantages are realized through the techniques of exemplary embodiments of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the exemplary embodiments of the invention, together with advantages and features, by way of example with reference to the drawings.

DETAILED DESCRIPTION OF THE INVENTION

Figure 1:
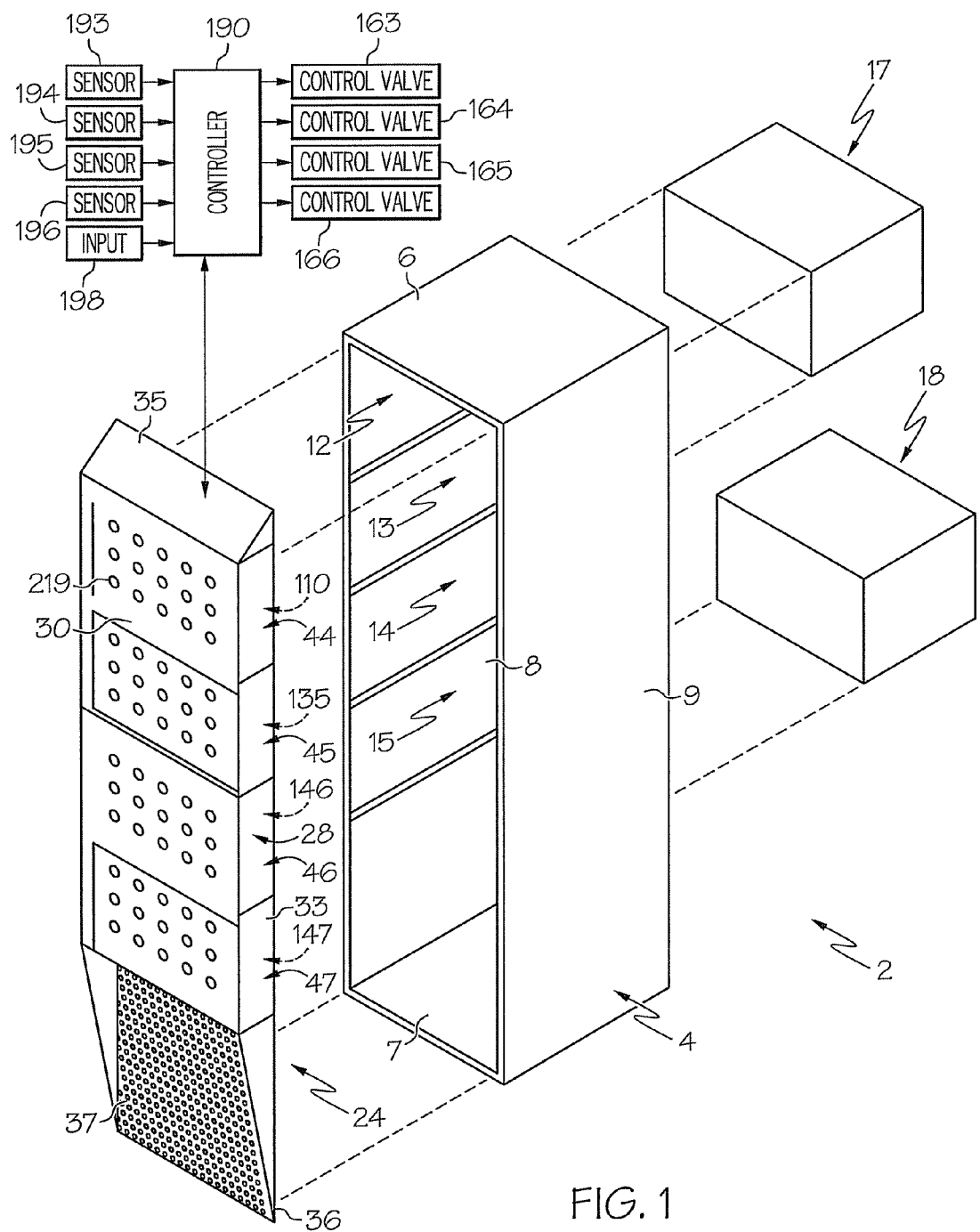
FIG. 1 is a partially exploded front right perspective view of an electronic device cabinet including a temperature control system constructed in accordance with an exemplary embodiment of the present invention.
Figure 2:
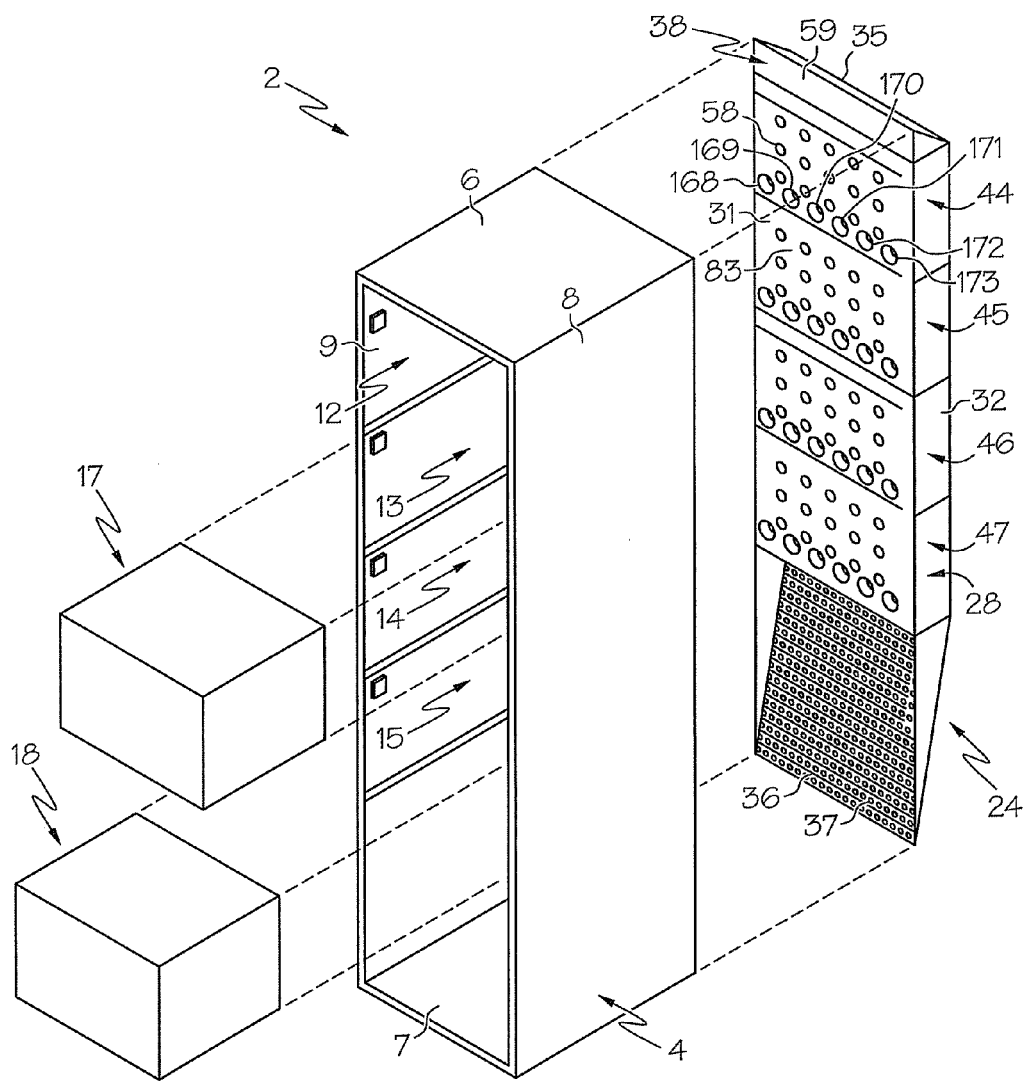
FIG. 2 is a left rear perspective view of the electronic device cabinet of FIG. 1.

With initial reference to FIGS. 1 and 2, an electronic device cabinet, constructed in accordance with an exemplary embodiment of the present invention, is generally indicated at 2. Cabinet 2 includes a housing 4 having a top wall 6, a bottom wall 7, and first and second opposing side walls 8 and 9 that collectively define a first electronic device storage zone 12, a second electronic device storage zone 13, a third electronic device storage zone 14, and a fourth electronic device storage zone 15. In the embodiment shown, a first electronic device 17, is configured to be received within first electronic device storage zone 12 and a second electronic device 18 is configured to be received within fourth electronic device storage zone 15. In the embodiment shown, each electronic device 17 and 18 is constituted by a plurality of server devices employed in connection with a network. Of course, first and second electronic devices 17 and 18 can also include data storage devices, power supply devices, power backup devices, and the like. In general, first and second electronic devices 17 and 18 produce heat that elevates internal temperatures of cabinet 2. As further illustrated in FIGS. 1 and 2, cabinet 2 includes a door 24 having a main body 28 including a first, out of panel portion 30, a second, inner panel portion 31, a first side panel 32, and second side panel 33. Main body 28 further includes a top panel 35 and bottom panel 36. Bottom panel 36 includes a plurality of lower openings, indicated generally at 37, that serve as an ambient air inlet, while top panel 35 includes an upper opening 38 that provides an outlet for heated air as will be described more fully below.

Figure 3:
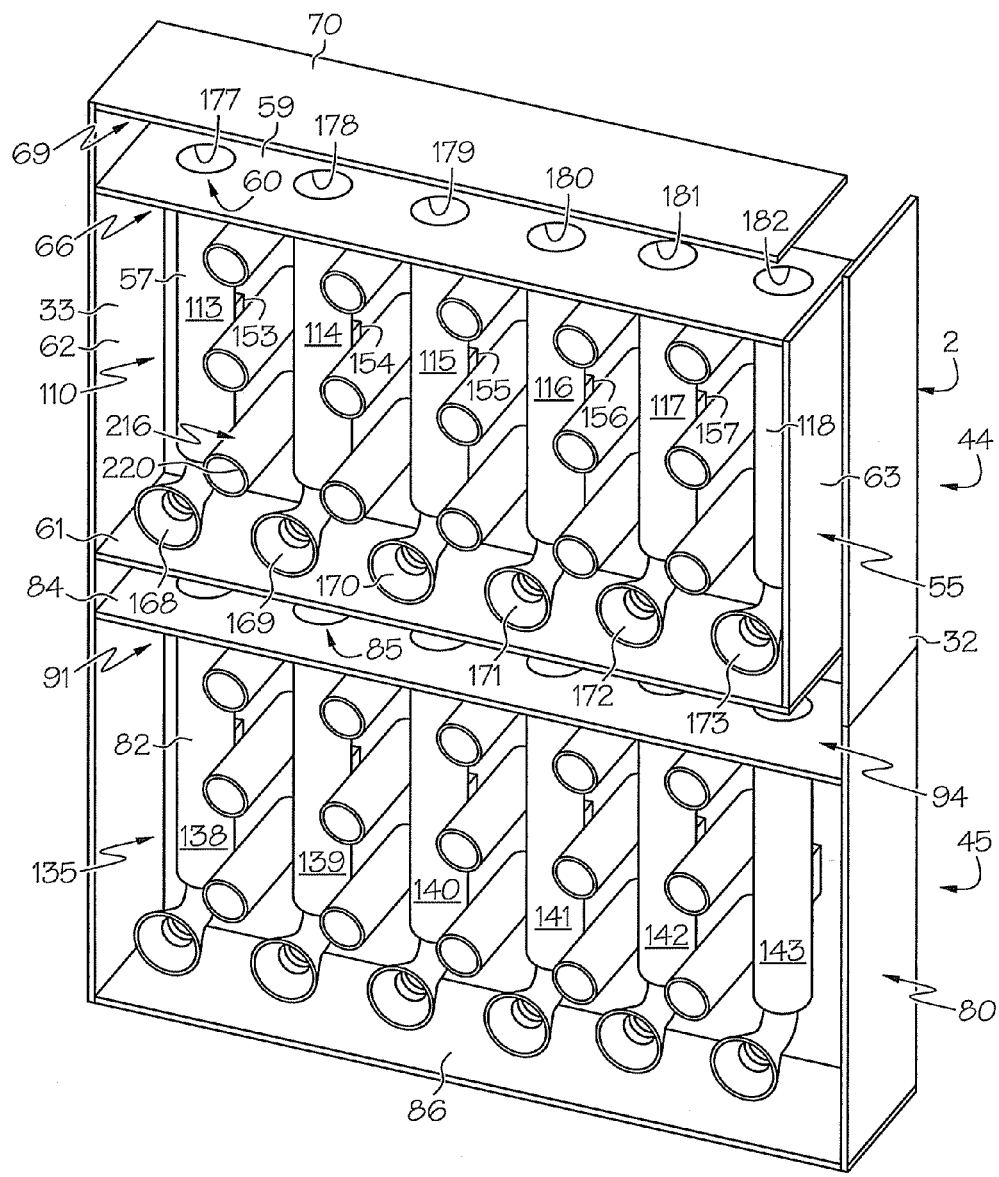
FIG. 3 is a perspective view of a temperature control system constructed in accordance with an exemplary embodiment of the present invention incorporated into a door portion of the electronic device cabinet of FIG. 2.
Figure 4:
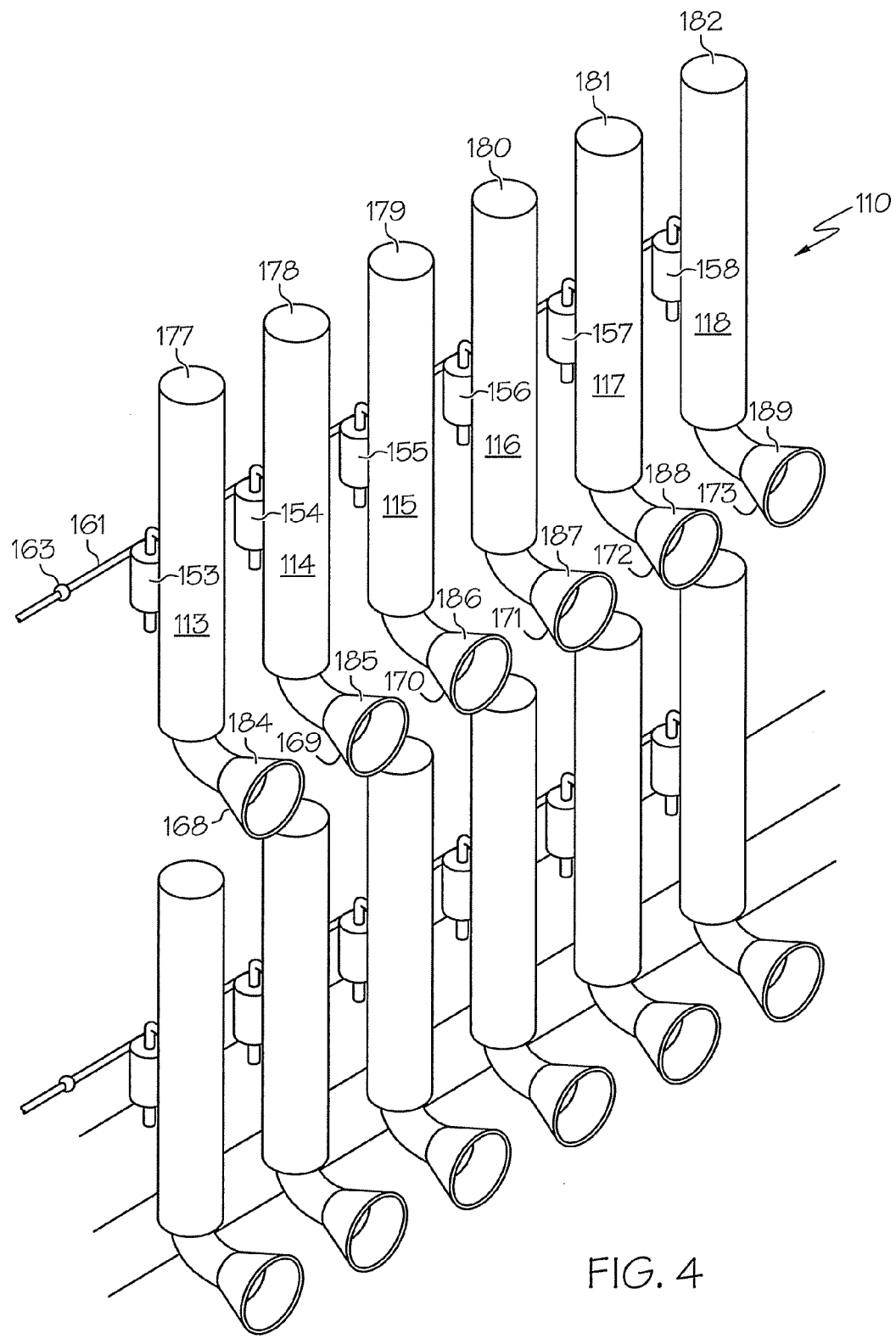
FIG. 4 is a left perspective view of a vortex member portion of the temperature control system of FIG. 3.

In accordance with an exemplary embodiment of the present invention, cabinet 2 includes a plurality of temperature control zones that correspond to electronic devices storage zones 12-15 respectively. More specifically, cabinet 2 includes a first temperature control zone 44, a second temperature control zone 45, a third temperature control zone 46, and a fourth temperature control zone 47. Of course it should be understood that each temperature control One 12-15 could be further divided into sub-zones (not separately labeled) in order to regulate temperatures for particular portions of each electronic device storage zone. In any case, as each temperature control zone 44-47 is similarly formed, a detailed description will follow with references to FIGS. 3 and 4 in describing temperature control zones 44 and 45 with an understanding that the remaining temperature control zones, i.e., temperature control zones 46 and 47 are similarly constructed.

As shown, first temperature control zone 44 is arranged within a first air plenum 55 provided on door 24 between outer and inner panels 30 and 31. First air plenum 55 includes a first wall member 57, a second wall member 58, (see FIG. 2), a top wall 59 having a plurality of openings, one of which is indicated at 60, a bottom wall member 61 and a pair of opposing side wall members 62 and 63 that collectively define a temperature control system housing 66. First air plenum 55 also includes an exhaust passage/duct 69 that extends between top wall 59 and an upper wall member 70. Exhaust duct 69 directs heated air from first air plenum 55 though upper opening 38 and out of cabinet 2 in a manner that will be described more fully below.

A second air plenum 80 is arranged adjacent to first air plenum 55. As shown, second air plenum 80 includes a first wall member 82, a second wall member 83 (see FIG. 2), a top wall member 84 having a plurality of openings, one of which is indicated at 85, and a bottom wall member 86 that collectively define a second temperature control system housing 91. In a manner similar to that described of above, second air plenum 80 includes an exhaust passage/duct 94 that extends between top wall member 84 and bottom wall member 61 of first air plenum 55. Exhaust duct 94 conducts heated air from second air plenum 80, through upper opening 38 out from cabinet 2. At this point it should be realized that while first and second temperature control system housings 66 and 91 are depicted as being associated with door 24, various other configurations are also acceptable. For instance, temperature control system housing can be provided on a real wall or door (not shown), divided between door 24 and a rear wall or arranged on sidewalls 8 and 9.

In further accordance with the exemplary embodiment shown, cabinet 2 includes a first temperature control system 110 arranged within first air plenum 55. First temperature control system 110 includes a plurality of vortex tubes 113-118 arranged in an array upon first wall 57 of first air plenum 55. Similarly, a second temperature control system 135 is arranged with second air plenum 80. Second temperature control system 135 includes a plurality of vortex tubes 138-143 that are arranged in an array on first wall member 82 of second air plenum 80. First and second temperature control systems 110 and 135 are configured to selectively deliver cooling air into respective ones of first and second electronic device storage zones 12 and 13 in a manner that will become more fully evident below. At this point it should be understood that cabinet 2 includes additional temperature control systems 146 and 147 that provide cooling air for electronic device storage zones 14 and 15 respectively. However, as each temperature control system 110, 135, 146 and 148 is similarly formed, reference will be made to FIG. 4 in describing temperature control system 110 with an understanding that the remaining temperature control systems 135, 146 and 147 are similarly constructed.

As shown, the plurality of the vortex tubes 113-118 include a corresponding plurality of inlet portions 153-158 that are fluidly connected to an inlet manifold 161. As shown, inlet manifold 161 is provided with a control valve 163 that, as will be described more fully below, controls a flow of compressed air that is selectively delivered to each of the plurality of inlet portions 153-158. At this point it should be understood that cabinet 2 includes additional control valves 164-166 that selectively control a flow of compressed air to temperature control systems 135, 146 and 147 respectively. In addition, the plurality of the vortex tubes 113-118 include a corresponding plurality of first outlet portions 168-173 and a corresponding plurality of second outlet portions 177-182. Each of the plurality of first outlet portions 168-173 includes an air horn 184-189 respectivly that is configured to diffuse a flow a cooling air into first electronic device storage zone 12. Conversely, each of the plurality of second outlet portions 177-182 guides heated air, a by-product of the operation of the plurality of vortex tubes 113-118, into exhaust duct 69. More specifically, the heated air passes from exhaust duct 69, through upper opening 38 provided on door 24, and out from cabinet 2.

In further accordance with the exemplary embodiment of the invention, cabinet 2 includes a control 190 that is operatively connected to a plurality of temperature sensors 193-196 as well as control valves 163-164. Each sensor 193-196 is positioned in a corresponding one of electronic device storage zones 12-15 to detect an average internal temperature therein. Control 190 is also operatively connected to an input member 198 that allow input of selected target temperatures for each electronic device storage zone 2-15. That is, as will become more fully evident below, control 190 selectively operations each temperature control system 110, 135, 146 and 147 to control internal temperature of portions of cabinet 2, namely, internal temperatures of each electronic device storage zone.

In any event, it should be understood that controller 190 comprises any appropriate high-powered solid-state switching device. As illustrated, control 190 is represented as a computer. However, this is merely exemplary of an appropriate high-powered control, which is within the scope of the invention. For example but not limiting of the invention, control 190 can include a main or central processor section for overall, system-level control, and separate sections dedicated to performing various different specific combinations, functions and other processes under control of the central processor section. It will be appreciated by those skilled in the art that control 190 can also be implemented using a variety of separate dedicated or programmable integrated or other electronic circuits or devices, such as hardwired electronic or logic circuits including discrete element circuits or programmable logic devices, such as PLDs, PALs, PLAs or the like. Control 190 can also be implemented using a suitably programmed general-purpose computer, such as a microprocessor or microcontroller, or other processor device, such as a CPU or MPU, either alone or in conjunction with one or more peripheral data and signal processing devices. In general, any device or similar devices on which a finite state machine capable of implementing the flow charts, as illustrated in the application can be used as the control. As shown a distributed processing architecture is a preferred for maximum data/signal processing capability and speed.

Figure 5:
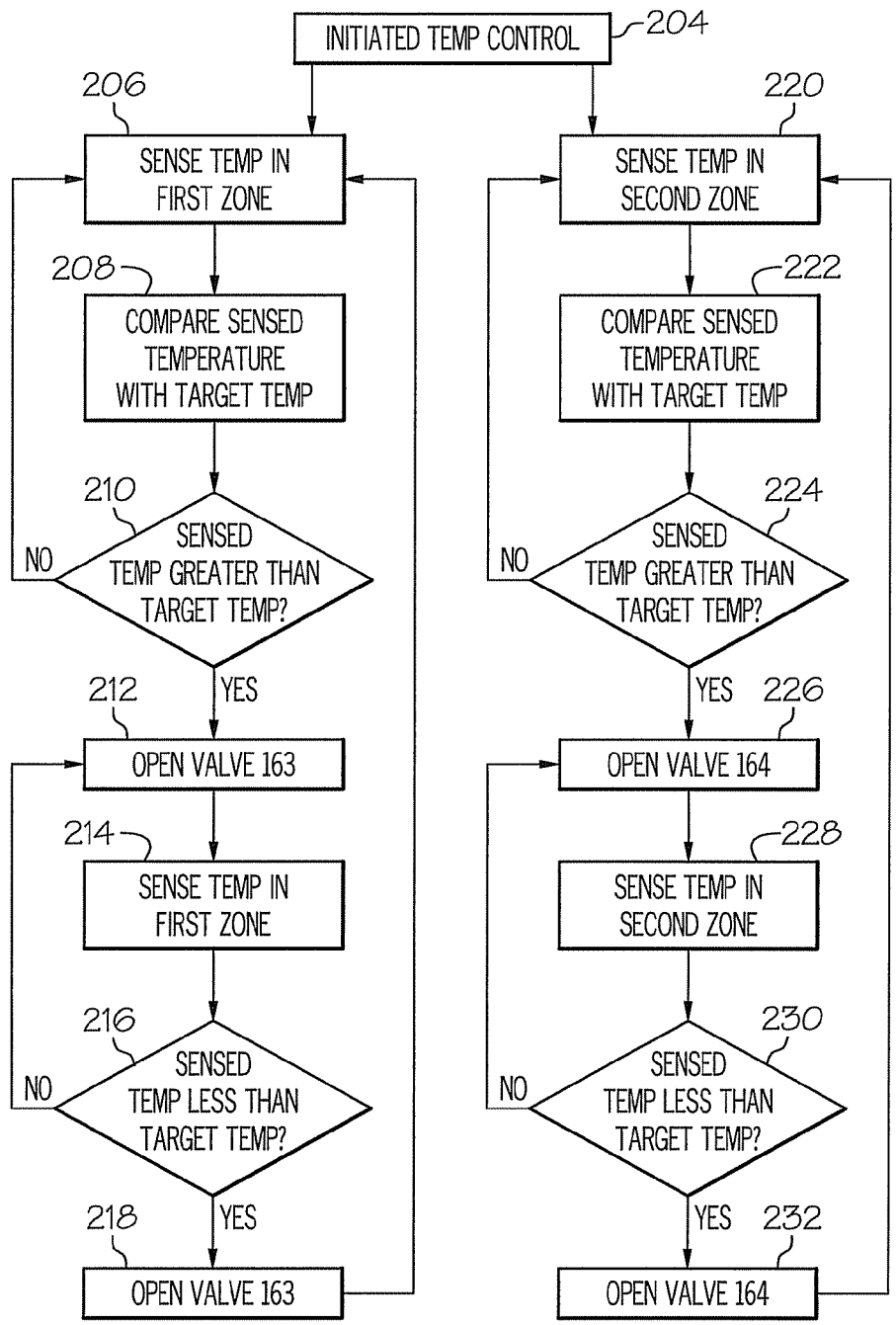
FIG. 5 is a flow chart illustrating an exemplary method of operating the temperature control system of FIG. 1.

Reference will now be made to FIG. 5, which illustrates a method of operating first and second temperature control systems 110 and 135 to selectively cool portions of cabinet 2. More specifically, upon initiating a temperature control scheme as indicated in block 204, control 190 begins to collect temperature data from sensor 193 positioned in first electronic device storage zone 12 in block 206. Control 190 compares the temperature data collected from sensor 193 with a target temperature input through input member 198 in block 208. If the temperate data is less than the target temperature, control 190 continues monitoring internal temperatures in first electronic device storage zone 12. If the temperate data collected in block 206 is greater than the target temperature, a demand for cooling is indicated and control 190 opens valve 163 to admit compressed air into inlet portion 153 as indicated in block 212. At this point, compressed air flows into each of the plurality of vortex tubes 113-118. The compressed air passing into each vortex tube 113-118 bifurcates into a first cooling portion that passes into first electronic device storage zone 12 and a second portion that passed into exhaust duct 69, up through door 24, out from upper opening 38 and away from cabinet 2. At this point, control 190 continues to monitor temperatures within first electronic device storage zone 12 in block 214. Control 190 continues to compare the temperatures sensed in block 214 with the target temperature as indicated in block 216. If the temperature sensed in block 214 is greater than the target temperature, control valve 163 remains open. On the other hand, if the temperature sensed in block 214 is less than the target temperature the demand for cooling is satisfied. At this point, control 190 closes valves 163 and returns to monitoring temperatures first electronic device storage zone 12 in block 206.

At the same time, control 190 begins to collect temperature data from sensor 194 positioned in second electronic device storage zone 13 in block 220. Control 190 compares the temperature data collected from sensor 194 with a target temperature input through input member 198 in block 222. If the temperate data is less than the target temperature, control 190 continues monitoring internal temperatures in second electronic device storage zone 13. If the temperate data collected in block 220 is greater than the target temperature, a demand for cooling is indicated and control 190 opens valve 164 to admit compressed air into each of the second plurality of vortex tubes 138-143 as indicated in block 226. In a manner similar to that described above, the compressed air passing into each vortex tube 138-143 bifurcates into a first cooling portion that passes into second electronic device storage zone 13 and a second portion that passes into exhaust duct 94 up through door 24, out from upper opening 38 and away from cabinet 2. At this point, control 190 continues to monitor temperatures within second electronic device storage zone 13 in block 228. Control 190 continues to compare the temperatures sensed in block 228 with the target temperature as indicated in block 230. If the temperature sensed in block 228 is greater than the target temperature, control valve 164 remains open. On the other hand, if the temperature sensed in block 228 is less than the target temperature, the demand for cooling is satisfied. At this point, control 190 closes valves 164 and returns to monitoring temperatures in second electronic device storage zone 13.

At this point, it should be appreciated that third and fourth electronic device storage zones are operated in a similar manner to provide selective cooling for a plurality of electronic devices arranged within an electronic device storage cabinet. That is, the present invention embodiments selectively activates separate and discreet cooling systems arranged in a single cabinet in order to target high heat produces while, at the same time, controlling temperature in other potions in the cabinet. In this manner, cooling demand is satisfied and available resources used in an efficient manner. In addition, it should be appreciated that each vortex tube could be considered an individual zone. That is, each vortex tube can be configured selectively deliver more or less cooling to particular portions of cabinet 2 depending upon individual component cooling requirements. Also, it should be appreciated that the vortex tubes can be controlled as a group or array as described above or as individual units.

At this point it should be understood that the flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention. While the preferred embodiment to the invention has been described, it will be understood that those skilled in the art, both now and in the future, may make various improvements and enhancements which fall within the scope of the claims which follow. These claims should be construed to maintain the proper protection for the invention first described.

The invention claimed is:

1. An electronic device cabinet comprising:
    a housing including at least a top wall and first and second opposing side walls, that collectively define first and second electronic device storage zones;
    a first temperature control system positioned to direct a conditioned airflow into the first electronic device storage zone, the first temperature control system including a first plurality of vortex tubes, each of the first plurality of vortex tubes including a compressed air inlet, a cooling air outlet and a heated air outlet, the cooling air outlet selectively guiding cooling air into the first electronic device storage zone, the first temperature control system including a first air plenum having first and second opposing wall members interconnected by a top wall member and a bottom wall member that collectively define a first temperature control system housing;
    a second temperature control system positioned to direct a conditioned airflow into the second electronic device storage zone, the second temperature control system including a second plurality of vortex tubes, each of the second plurality of vortex tubes including a compressed air inlet, a cooling air outlet and a heated air outlet, the cooling air outlet selectively guiding cooling air into the second electronic device storage zone, the second temperature control system including a second air plenum having first and second opposing wall members interconnected by a top wall member and a bottom wall member that collectively define a second temperature control system housing; and a controller operatively connected to each of the first and second temperature control systems, wherein the controller selectively delivers compressed air to the first temperature control system upon sensing a demand for cooling in the first electronic device storage zone and selectively delivers compressed air to the second temperature system upon sensing a demand for cooling in the second electronic device storage zone.

2. The electronic device cabinet according to claim 1, further comprising: a door mounted to the housing, the door being selectively moveable to provide access to the at least one electronic device storage zone, wherein each of the first and second air plenums are provided in the door.

3. The electronic device cabinet according to claim 1, further comprising:

a first plurality of baffles extending between the first and second opposing wall members in the first temperature control system housing; and a second plurality of baffles extending between the first and second opposing wall members in the second temperature control system housing.

4. The electronic device cabinet according to claim 3, wherein each of the first plurality of baffles defines a conduit passing ambient air into the first electronic device storage zone, and each of the second plurality of baffles defines a conduit passing ambient air into the second electronic device storage zone.

5. The electronic device cabinet according to claim 1, further comprising:

a first temperature sensor mounted in the first electronic device storage zone, the first temperature sensor being operatively connected to the controller and configured to sense a first temperature of the first electronic device storage zone.

6. The electronic device cabinet according to claim 5, further comprising:

a second temperature sensor mounted in the second electronic device storage zone, the second temperature sensor being operatively connected to the controller and configured to sense a first temperature of the first electronic device storage zone.

7. A method of regulating internal temperatures of an enclosure, the method comprising:

sensing a first temperature in a first electronic device storage zone of the enclosure;

comparing the first temperature sensed in the first electronic device storage zone with a first target temperature;

sensing a second temperature in a second electronic device storage zone of the enclosure;

comparing the second temperature sensed in the second electronic device storage zone with a second target temperature;

selectively introducing a compressed air stream to a first plurality of vortex tubes configured to direct a first cooling air flow into the first electronic device storage zone when the first temperature is greater than the first target temperature, the first plurality of vortex tubes being arranged in a first temperature control system housing; and selectively introducing a compressed air stream to a second plurality of vortex tubes configured to direct a second cooling air flow into the second electronic device storage zone when the second temperature is greater than the second target temperature, the second plurality of vortex tubes beinged in a second temperature control system housing.

8. The method of claim 7, wherein the first cooling air flow is directed though a first outlet portion of each of the first plurality of vortex tubes.

9. The method of claim 8, wherein first cooling air flow is directed though a cabinet door into the first electronic device storage zone.

10. The method of claim 8, wherein the second cooling air flow is directed though a first outlet portion of each of the second plurality of vortex tubes.

11. The method of claim 10, wherein the second cooling air flow is directed through a cabinet door into the second electronic device storage zone.

12. The method of claim 10, further comprising: guiding a first heated air flow out from a second outlet portion of each of the first plurality of vortex tubes.

13. The method of claim 12, wherein the first heated airflow is directed through an upper opening provided on the cabinet door.

14. The method of claim 10, further comprising: guiding a second heated air flow from a second plurality of outlet portions of each of the second plurality of vortex tubes.

15. The method of claim 14, wherein the second heated airflow is directed through an upper opening provided on the cabinet door.

* * * * *